(12) United States Patent  
Bruin et al.

(10) Patent No.: US 7,939,851 B2
(45) Date of Patent: May 10, 2011

(54) ELECTRONIC DEVICE WITH AN AMPLIFIER OUTPUT STAGE AND AN OVER-CURRENT DETECTION MEANS

(75) Inventors: Paulus Petrus Franciscus Maria Bruin, Nijmegen (NL); Mike Hendrikus Splithof, Silvolde (NL)

(73) Assignee: NXP B.V., Eindhoven (NL)

( * ) Notice: Subject to any disclaimer, the term of this patent is extended or adjusted under 35 U.S.C. 154(b) by 695 days.

(21) Appl. No.: 12/067,970

(22) PCT Filed: Sep. 19, 2006

(86) PCT No.: PCT/IB2006/053356
§ 371 (c)(1),
(2), (4) Date: Mar. 25, 2008

(87) PCT Pub. No.: WO2007/034403
PCT Pub. Date: Mar. 29, 2007

(65) Prior Publication Data
US 2008/0211483 A1 Sep. 4, 2008

(30) Foreign Application Priority Data

Sep. 26, 2005 (EP) .................................... 05108858

(51) Int. Cl.
*H01L 29/66* (2006.01)

(52) U.S. Cl. ......................................... 257/173; 327/20
(58) Field of Classification Search .................. 257/173; 327/20
See application file for complete search history.

(56) References Cited

U.S. PATENT DOCUMENTS

| | | | |
|---|---|---|---|
| 3,555,358 A | | 1/1971 | Gibbs |
| 4,481,553 A | | 11/1984 | Owen et al. |
| 4,544,981 A | | 10/1985 | Hakoopian |
| 5,009,764 A | * | 4/1991 | Siefkes et al. ........... 204/298.08 |
| 5,036,260 A | | 7/1991 | George |
| 5,835,161 A | | 11/1998 | Keller |
| 5,896,263 A | | 4/1999 | Terdan et al. |
| 6,014,059 A | | 1/2000 | Nordwall |
| 6,801,058 B1 | * | 10/2004 | Jiandong ........................ 327/20 |

FOREIGN PATENT DOCUMENTS
WO 9931876 A1 6/1999
* cited by examiner

Primary Examiner — Douglas M Menz

(57) ABSTRACT

An electronic device with an amplifier output stage (OS) and an over-current detection means (OCDM) for detecting an output over-current (IHS, ILS) of the output stage (OS) is provided. The over-current detection means (OCDM) comprises a level detection means (LDM) for detecting a level of the output current (IO) exceeding a first level of the output current (IDET), and a timing detection means (TDM) for detecting a duration during which the output current (IO) exceeds the first current level (IDET) being a maximum current level.

10 Claims, 9 Drawing Sheets

ELECTRONIC DEVICE WITH AN AMPLIFIER OUTPUT STAGE AND AN OVER-CURRENT DETECTION MEANS

The invention is related to an electronic device with an amplifier output stage and an over-current detection means for detecting an output over-current of the output stage. The invention further relates to a method for detecting an over-current of an amplifier output stage of an electronic device.

The thermal resistance to handler wafer of power transistors in silicon-on-insulator (SOI) technology is considerably larger than power transistors in bulk technology. Accordingly, for a similar amount of dissipated power in an output device of an amplifier, the devices in an SOI process will be more subject to self-heating. Excessive self-heating, caused for example by short circuits at the amplifier output, can damage the output devices. Increasing the physical dimensions of the output devices can decrease thermal resistance, but generally the maximum output current, and thereby the power dissipation, increases simultaneously.

For nominal signals the voltage across the output devices will be, on average, somewhere around half the supply voltage. Furthermore, for capacitive loads, signal currents are divided in time between the two output devices. The maximum value is not reached all the time. Accordingly, the signal power in any given output device will generally be much less than maximum power during short circuits, during which a maximum current and voltage is applied to one of the output devices.

A common way of detecting whether or not a given device is subject to overheating relates to merely monitoring its temperature. For certain technologies (e.g. SOI) this involves adding a temperature-sensing device inside the output device. A sensor outside the device is useless as the isolating oxide prevents the heat from propagating to the temperature sensor. To avoid the high voltages that occur at one side of the output device, the sensor has to be incorporated in the opposite side of a high-voltage MOS or bipolar transistor. Accordingly, the heat has to propagate from the dissipation area, which is normally near the drain or collector, to the sensor, which is located at one of the sides. Especially in high-voltage SOI technologies, such a process takes a considerably long time, as the heat has to travel through a very thin layer of silicon. As a consequence, the described approach of detecting overheating is too slow and inadequate for protecting the device.

Another way of detecting over-heating is to monitor current and voltage in order to obtain an equivalent of the dissipated power by calculating the product. Starting from the worst-case die temperature, the power and thermal impedance can be used to calculate whether or not the output device might be too hot. Detecting the output voltage is a complex task in amplifiers, where the output voltage can be higher than the voltage applicable to gates or bases of transistors. Such an approach requires circuits able to withstand high voltages with high-voltage devices, which in turn consumes a lot of chip area.

A simpler way to detect possible overheating is to merely measure current. According to this approach, the maximum current that can occur during worst-case signal conditions is to be determined and any current exceeding this level is assessed as a fault condition. The output devices have to be dimensioned such that they can withstand this current under worst-case ambient temperature conditions, in order to withstand overheating during worst-case signal conditions.

This concept can be improved by adding a low pass filter to the current measurement unit, with a time constant matching the thermal time constant of the output devices. This way, the accuracy of the predicted output device temperature is improved. Accordingly, the current detection mechanism will not trigger in response to an instantaneous peak current level, but rather in response to an average value.

The U.S. Pat. No. 6,014,059 discloses a power amplifier with an over-current detection mechanism. The amplifier includes a transistor for amplifying an input signal in order to provide an amplified output signal, and a module for controlling the input signal received at the input terminal. The module generates a control signal which substantially follows the temperature of the transistor in a selected temperature range. The module for controlling the input signal controls the input signal such that the control signal is prevented from exceeding a predetermined level by means of an average level detector. The time-constant of the average level detector can be equal to the "thermal time-constant" of the device.

It is an object of the invention to provide an electronic device with an output stage and an improved over-current detection circuitry as well as a method for improved over-current detection.

This object is solved by an electronic device according to claim 1, and a method according to claim 8.

Therefore, an electronic device is provided with an amplifier output stage and an over-current detection means for detecting an output over-current of the output stage. The over-current detection means includes a level detection means for detecting a level of the output current exceeding a first level of the output current, and a timing detection means for detecting a duration during which the output current exceeds the first current level, wherein the first current level is a maximum current level. Accordingly, the output current is controlled with respect to its amplitude, i.e. if the amplitude exceeds the first level, and the duration of the respective amplitude exceeding the predefined first level. While prior art solutions average the output current by use of an averaging low-pass filter in order to implement a time constant corresponding to the thermal time constant of the output device, the present invention detects over-currents beyond a predetermined level and detects a fault condition, if the over-current lasts for an inadmissibly long period of time.

According to an aspect of the invention, the output stage includes a high-side output device and a low-side output device. In account of this configuration, the over-current detection means includes a current difference detection means for detecting a difference between the low-side output current flowing through the low-side output device and the high-side output current flowing through the high-side output device, wherein the over-current detection means detects by use of the current difference detection means whether the current difference exceeds the predefined first current level. Accordingly, the current difference detection means allows to detect a difference of over-currents of the high-side and the low-side output device. Known over-current control mechanisms detect only the combined amount of the output current without distinguishing between high-side and low-side currents. However, for most applications, the high-side and low-side output currents of an amplifier output stage are almost equal during normal operation. Therefore, the current difference detection means establishes an additional safeguard by surveying fault conditions with respect to the difference of high- and low-side currents.

According to another aspect of the invention, the over-current detection means includes a first comparing means to determine whether the difference between the low-side output current and the high side output current exceeds a predefined positive first current level and a second comparing means to determine whether the difference between the low-side output current and the high side output current exceeds a predefined negative second current level. Accordingly, the two over-currents flowing through the high-side and low-side device of the output stage are detected independently, e.g. by two different comparators.

In another preferred embodiment of the invention, the first and second comparing means are operately coupled to the timing detection means, and the timing detection means includes a single timer. The timer is operately coupled to the first and second comparing means, e.g. two comparators, in order to establish over-current timing control. Usually, an over-current occurs only in one of the output devices of the output stage at the time. Therefore, it is possible to use only a single timer as the timing detection means, detecting an over-current in either the first comparing means or the second detection means within the same period of time. This approach can reduce the complexity of the circuitry.

Preferably, the electronic device includes further a cathode ray tube (CRT), wherein the output stage is coupled to the cathodes of the CRT. The CRT and the amplifier output stage can be arranged in a displaying apparatus, as a television set, a computer monitor or the like. The output stage according to the invention having the above mentioned features is particularly suitable to control currents of CRTs as CRTs represent a mainly capacitive load for amplifier output stages.

Although the present invention is useful for all technologies, like bipolar, or MOS (Metal Oxide Silicon), the invention is particularly useful for silicon on insulator technologies (SOI). Accordingly, it is intended, that the electronic device, particularly the amplifier output stage, having the above mentioned features is at least partially implemented in a silicon on insulator technology. Since the thermal resistance to handler wafer of power transistors in silicon-on-insulator (SOI) technology is considerably larger than power transistors in bulk technology, the present invention serves particularly to prevent overheating of devices in SOI technologies.

The present invention also provides a method for detecting an over-current of an amplifier output stage of an electronic device. The method includes the step of detecting a level of the output current exceeding a first level of the output current, and the step of detecting a duration during which the output current exceeds the first level of the output current. Accordingly, the output current of the output stage is surveyed with respect to the amplitude and the time during which a predefined level of the current is exceeded, and not only with respect to average values of an output current as known from the prior art.

According to another aspect of the invention, the output stage comprises a high-side output device and a low-side output device. Now, the step of detecting a level of the output current exceeding a first level of the output current includes the step of determining the difference between the low-side output current flowing through the low-side output device and the high-side output current flowing through the high-side output device. Further, the method includes the step of detecting whether the determined current difference exceeds a predefined first current level. It is also preferred to compare the difference between the low-side output current and the high-side output current with a positive first current level, and to compare the difference between the low-side output current and the high-side output current with a negative second current level.

Accordingly, an over-current detection means and a corresponding method is provided that allows the output devices to be optimized for a certain signal output power instead of the power during fault conditions. The over-current detection means and the method according to the present invention distinguishes fault conditions, for example short circuits from normal signals. This is achieved by monitoring the currents in the output devices and by measuring the duration of current pulses. After detection of a fault condition, the output devices have to be protected or switched off.

According to the present invention, timing information is used to discriminate between normal signals and fault conditions. Compared to known solutions, not only the average level of the current through one of the output devices is detected, but the over-current detection mechanism determines how long the current pulses last. Additional advantage is drawn from the fact that for some applications the load of the so protected amplifier is mainly capacitive. Accordingly, the output current during normal signal conditions flows continuously in one direction only until the load capacitor is completely charged or discharged. Further, such a current occurs only for a limited amount of time. The current level detector is set to a level, which is chosen such that the output devices will not be destroyed even by an infinitely long current of the respective level. The timing detecting means is set to a time, such that the timer triggers before the output device is destroyed by overheating, if a worst-case fault condition occurs. The worst-case fault condition can include the maximum voltage over the output device, the maximum current through the output device, and ambient temperature conditions. For setting up the over-current detection means, a check might be carried out whether normal signals can cause both detection mechanisms—i.e. timing and current level—to trigger. Accordingly, the currents are determined which can occur if the maximum load capacitance is charged during the detection time over the maximum possible voltage swing. If the so established current level exceeds the respective maximum levels, the value for the maximum output current or the value for the maximum duration has to be increased. Usually, increasing the maximum current level is an appropriate first choice.

These and other aspects of the invention are apparent from and will be elucidated with reference to the embodiments described hereinafter and with respect to the following figures.

FIG. 1 shows a simplified schematic of an amplifier with a peak current detection circuit, FIG. 2 shows a simplified schematic of an amplifier with a low-pass current detection circuit, FIG. 3 shows a simplified schematic of an amplifier with an over-current detection means according to a first embodiment of the invention FIG. 4 shows a simplified schematic of an amplifier with an over-current detection means according to a second embodiment of the present invention;

Figure 1:
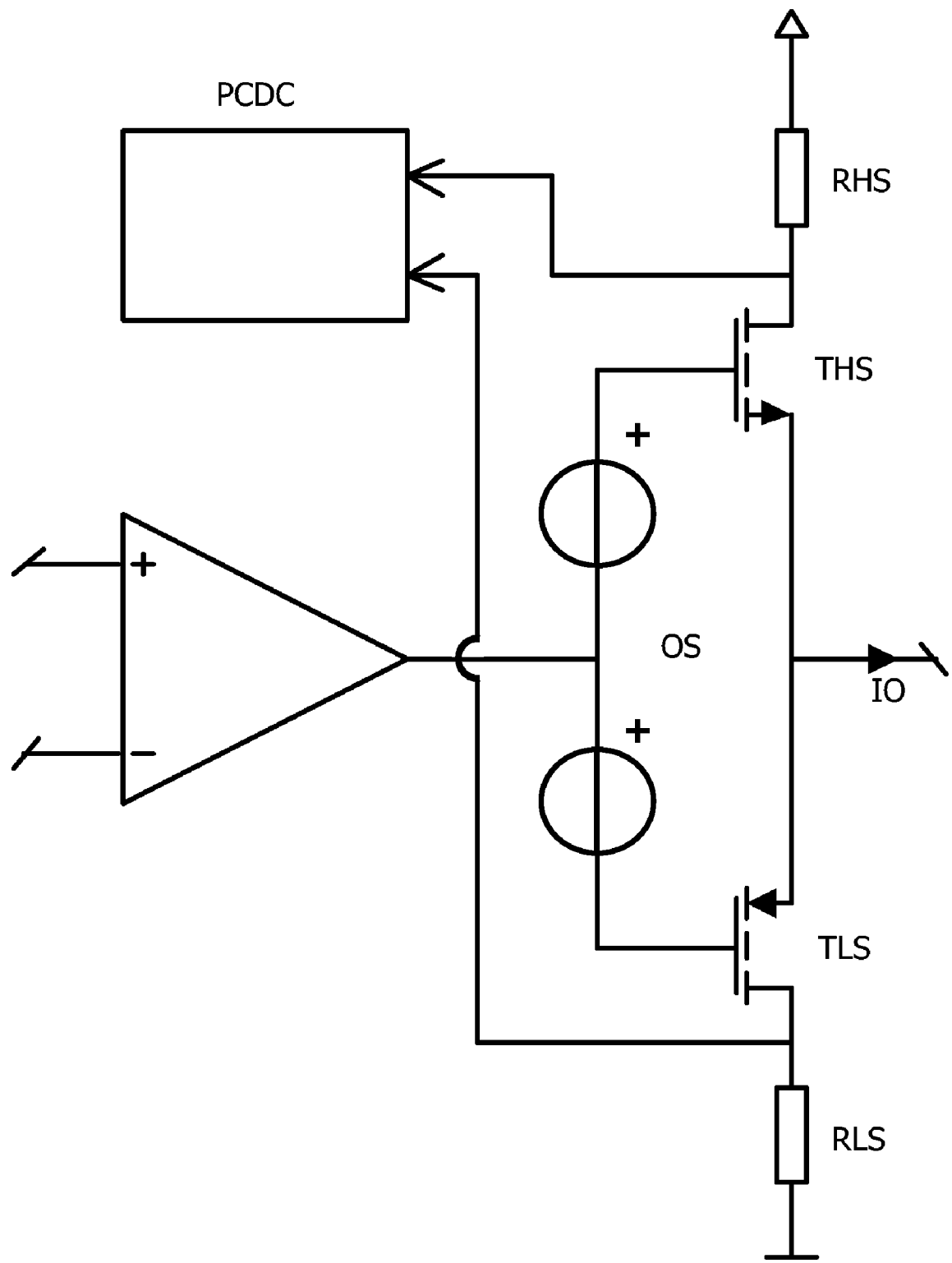

FIG. 1 shows a simplified schematic of an amplifier with a peak current detection circuit PCDC according to the prior art. The amplifier includes an output stage OS having two metal oxide silicon field effect transistors (MOSFETs) THS, TLS. The output transistors THS, TLS are arranged in a common drain configuration known in the art, wherein a first (high-side) transistor THS is coupled via a first resistor RHS to the supply voltage and a second (low-side) transistor TLS is coupled to ground via a second resistor RLS. The output current IO through the output stage OS is measured continuously based on the voltage drops across the resistors RHS, RLS, respectively. With respect to worst case signal conditions, a maximum allowable output current IO is determined. The output devices THS, TLS are dimensioned such that they can withstand this current under worst-case ambient temperature conditions without overheating. The power dissipation in the output transistors THS, TLS corresponds to the product of current through the devices and the voltage across the devices. Therefore, not only the current, but also the voltage across the devices THS, TLS is to be determined. During normal operating conditions, the average voltage on any of the output transistors THS, TLS is usually less than the supply voltage; typically around half the supply voltage. Based on this assumption, the area to be contributed to the output transistors THS, TLS to withstand a particular output current can be calculated, wherein the calculation takes account of the appropriate voltage. An output current IO exceeding the maximum allowable current level is registered by the peak current detection circuit PCDC as a fault condition.

Figure 2:
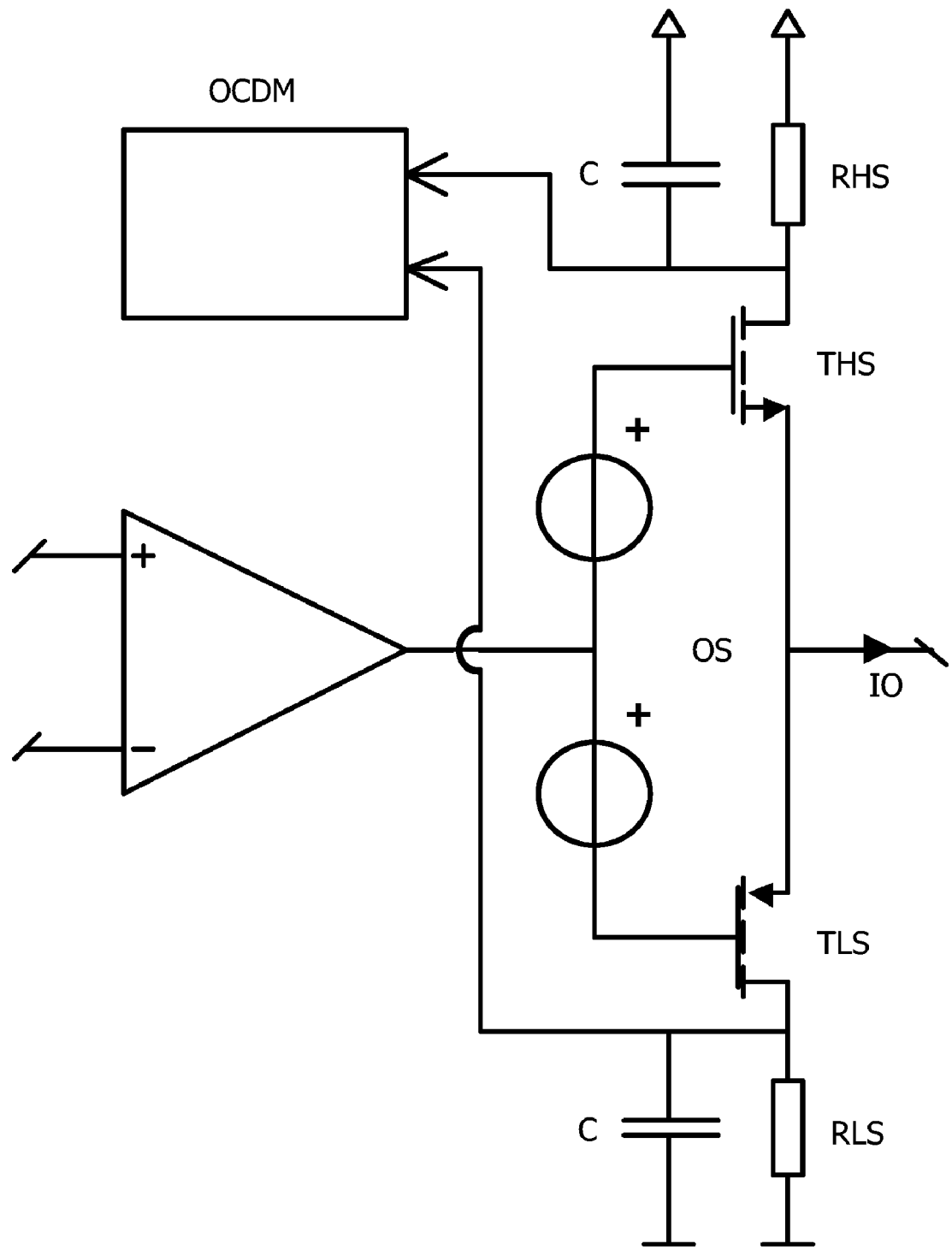

FIG. 2 shows a simple schematic of an amplifier including a low-pass over current detection mechanism OCDM according to the prior art. In the same manner as explained with respect to FIG. 1, the output stage OS includes a high-side and low-side transistor THS, TLS and two corresponding resistors RHS, RLS. The low-pass filter characteristics are established by two additional capacitors C being respectively coupled to the high-side and the low-side of the output stage OS. The low-pass filter ensures that for high frequency signals only the average value of the current IO through the output transistors THS, TLS is measured. In case of sine wave signals, the output current is a factor p lower than the peak current. Accordingly, the area of the output transistors can also be a factor p smaller than for the circuitry shown in FIG. 1. Even if under fault conditions a constant (DC) current IO flows, the current will still be correctly detected by the low-pass current detection circuit. An instantaneous current value is measured as long as its frequency remains within the bandwidth of the low-pass filter. However, for capacitive loads of the amplifier (not shown) and low frequencies the currents and the corresponding power dissipation is usually small. Short current peaks having frequencies above the bandwidth of the low-pass filter are reduced or suppressed, such that those currents will not be registered by the over current detection circuit OCDM as a fault condition.

Figure 3:
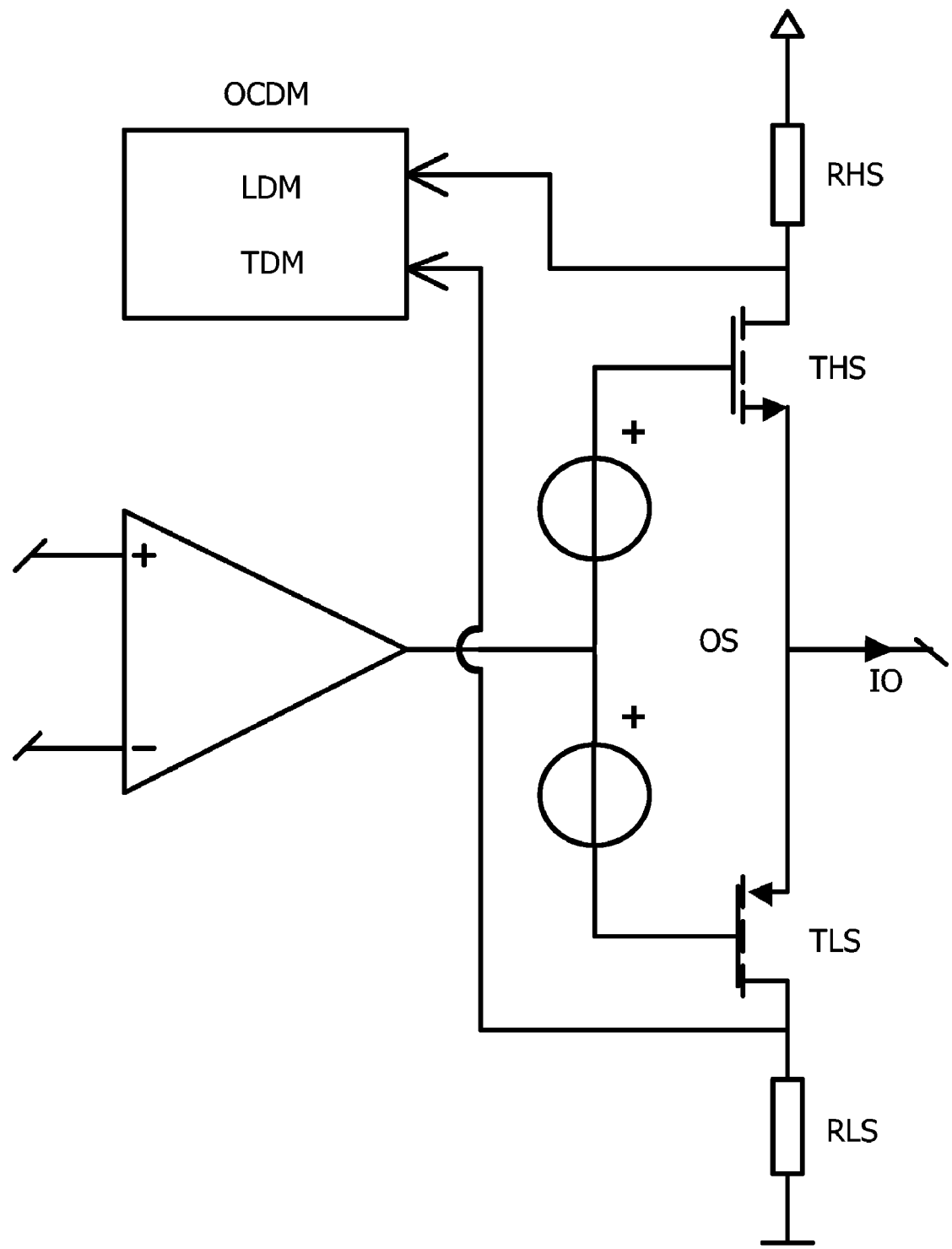

FIG. 3 shows a simplified schematic of an amplifier with an over-current detection means OCDM according to a first embodiment of the invention. Similar to the circuits shown in FIGS. 1 and 2, the amplifier includes an output stage OS having a high-side transistor THS and a low-side transistor TLS in a common drain arrangement and respective resistors RHS, RLS. According to this embodiment of the invention, the over-current detection means OCDM distinguishes between normal signals and fault conditions by use of timing information. Hence, not only the average level of the output current IO through one of the output devices THS, TLS is detected (as explained with respect to FIG. 2), but also the duration of an over-current pulse. According to this embodiment of the invention, the over current detection mechanism OCDM includes a current level detection mechanism LDM and a timing detection mechanism TDM. The current level detector LDM is set to a current level IDET. The current level IDET is selected such that the output devices THS, TLS are not destroyed even by an infinitely long output current IO at the determined level.

Additionally, the timing detector TDM is set to a time limit TDET. This time limit TDET is selected such that the timer indicates a fault condition before one of the output devices THS, TLS is destroyed by overheating. The maximum time limit TDET is chosen with respect to the worst-case fault condition, i.e. the maximum voltage drop over the output devices THS, TLS and the maximum allowable current IO through the output devices THS, TLS. The worst-case ambient temperature conditions are also taken into account for determining the time limit TDET. Accordingly, under any of these circumstances the timing detection mechanism TDM triggers before the transistors THS, TLS of the output stage OS will overheat. When the allowable duration of an over-current is established, it is useful to determine, whether normal signals can cause both detection mechanisms TDM, LDM to trigger. For capacitive loads (not shown) being coupled to the output stage OS, the output current IO flows continuously in one direction only until the load capacitor (not shown in FIG. 3) is entirely charged or discharged. Such a current occurs always only for a limited amount of time. Accordingly, the currents are to be determined, which the output transistors THS, TLS experience, while the maximum load capacitance is charged over the full detection time TDET and over the maximum possible voltage swing. If this current level exceeds IDET, the value of IDET or TDET has to be increased. Preferably, IDET is increased in a first step. Compared to a prior art detection mechanisms as shown e.g. in FIG. 2 not a low-pass filter is employed, but a timer.

Figure 4:
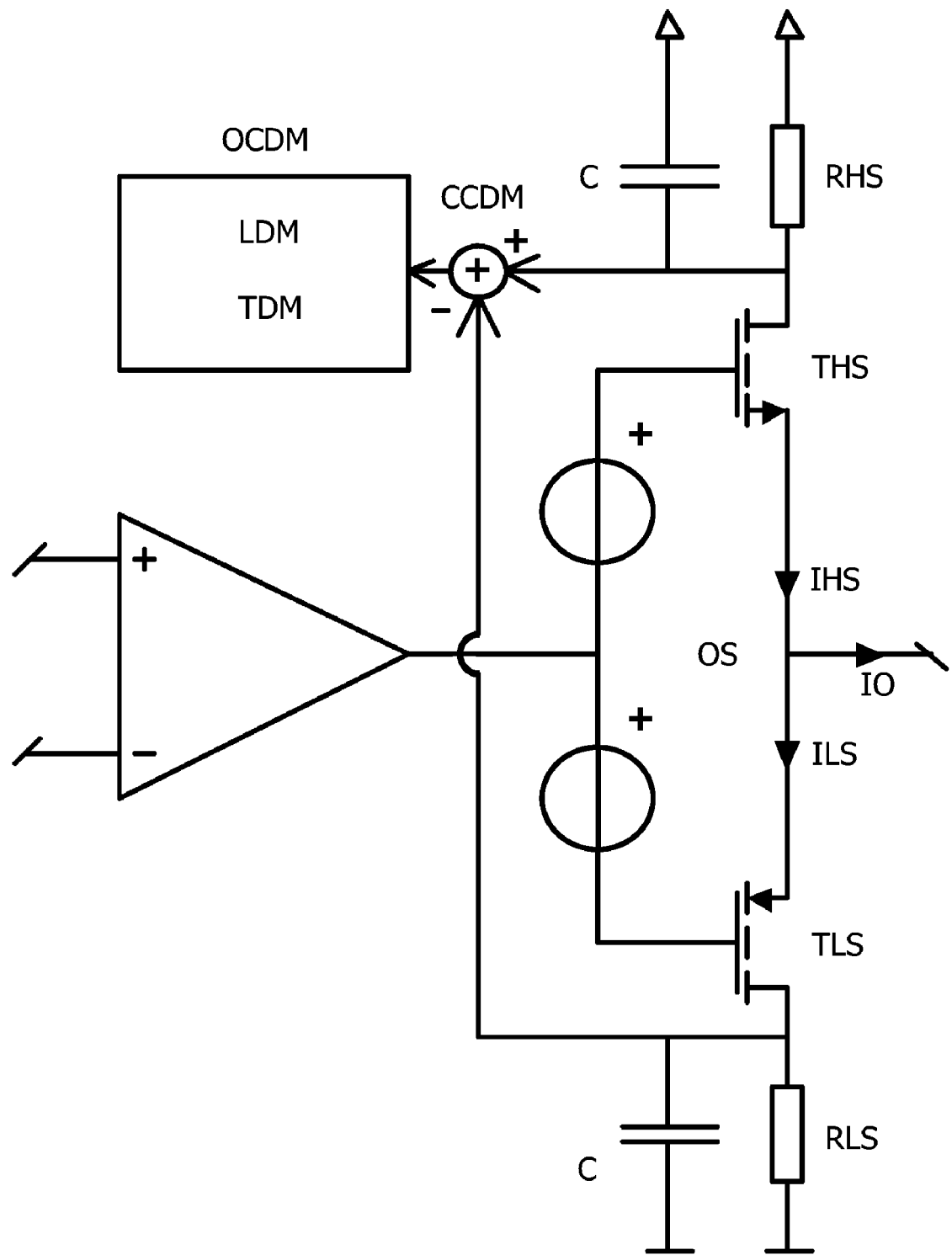

FIG. 4 shows a simplified schematic of an amplifier supplemented by an over-current detection means OCDM according to a second embodiment of the present invention. To further improve the discrimination between normal signals and fault conditions, the differences between high-side currents IHS through the transistor THS and low-side currents ILS through the transistor TLS are evaluated. The difference of the two currents IHS, ILS is determined by a current difference detection means CDDM, that is coupled between the output stage OS and the over-current detection means OCDM. Accordingly, currents flowing only through one of the output devices THS, TLS are detected. Particularly, for capacitive loads this is a reasonable choice, as normal signals will show at least in average exactly the same high-side and low-side currents IHS, ILS. However, fault conditions generally cause an over-current in only one of the output devices THS, TLS. The area of the transistors THS, TLS can be dimensioned by the worst case signals that can occur in the application. If for the previous solutions, the area contributed to the output devices THS, TLS was a factor p smaller than for prior art solutions, this embodiment of the invention may provide a gain of more than a factor p, if the maximum peak-to-peak voltage is lower than the supply voltage. This principle can also be used when small DC currents flow through the output stage OS under normal signal conditions, as long as these DC currents remain well below the detection level for fault conditions.

Figure 5:
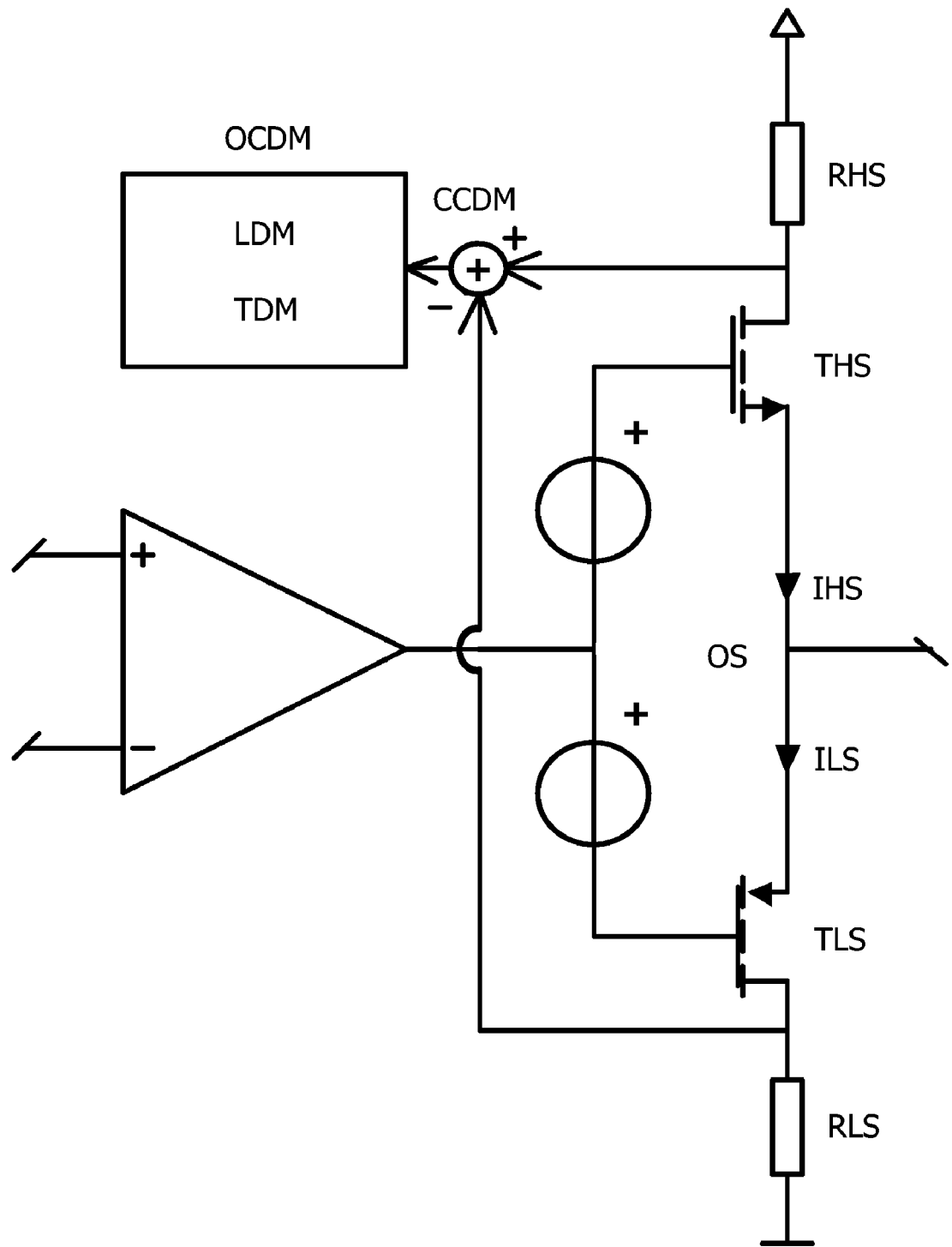
FIG. 5 shows a simplified schematic of an amplifier with an over-current detection means according to a third embodiment of the present invention.

FIG. 5 shows a simplified schematic of an amplifier with an over-current detection mechanism OCDM according to a third embodiment of the present invention. Apparently, the idea of using current differences between high-side and low-side as explained with respect to FIG. 4 can also be used in combination with the embodiment shown in FIG. 3. The resulting schematic can be found in FIG. 5. Accordingly, the current pulses flowing through one of the output devices THS, TLS are detected. According to the embodiment of FIG. 5, the over-current detection mechanism OCDM is only based on current level detection mechanism LDM, the timing detection mechanism TDM, and the current difference detection means CDDM.

Although the output devices THS, TLS shown in FIGS. 3 to 5 are MOS transistors in a common drain configuration, the current detection scheme can also be used for bipolar transistors or any other transistors, being arranged in any configuration other than the common drain circuitry, such as common source, common gate, common emitter, common collector, or common base.

Figure 6:
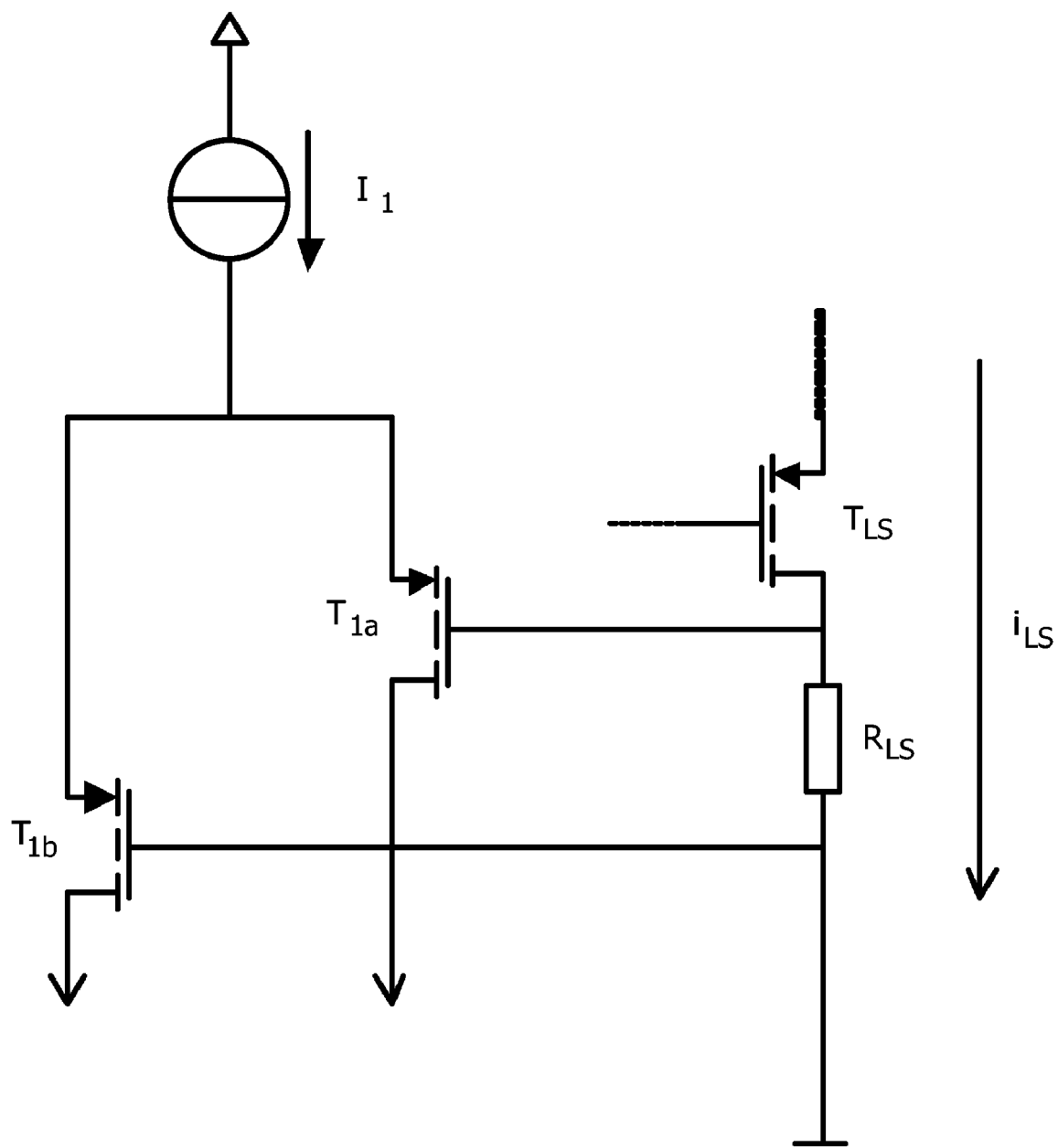
FIG. 6 shows a simplified schematic of a circuit for a current detection mechanism according to an aspect of the present invention.

FIG. 6 shows a simplified schematic of a circuit for current detection according to an aspect of the present invention. The circuit of FIG. 6 may be used for the embodiments shown in FIGS. 4 and 5. The current detection circuit shown in FIG. 6 serves to detect whether the absolute value of the difference between the high-side current IHS and the low-side current ILS exceeds a predefined level +/−IDET.

As for the other embodiments of the present invention, the output stage OS includes a sense resistors RLS in series with the drain of the output transistors TLS. A differential pair T1a, T1b converts the voltage across the sense resistor RLS into a differential output current, being a scaled copy of the output current ILS. The differential pair consists of PMOS transistors T1a, T1b. However, an implementation in NMOS is also possible. A similar circuit is used to measure the high side current IHS. Accordingly, two differential pairs are required to obtain scaled copies of ILS and IHS. A third pair is needed to generate a scaled copy of the current detection level +/−IDET. In order to measure the current difference IHS minus ILS, the measured low side current ILS is subtracted from the high side current IHS. The result is compared to a first positive current level IDET and to a second negative current level −IDET. Accordingly, all currents IHS, ILS have to be measured twice.

Figure 7:
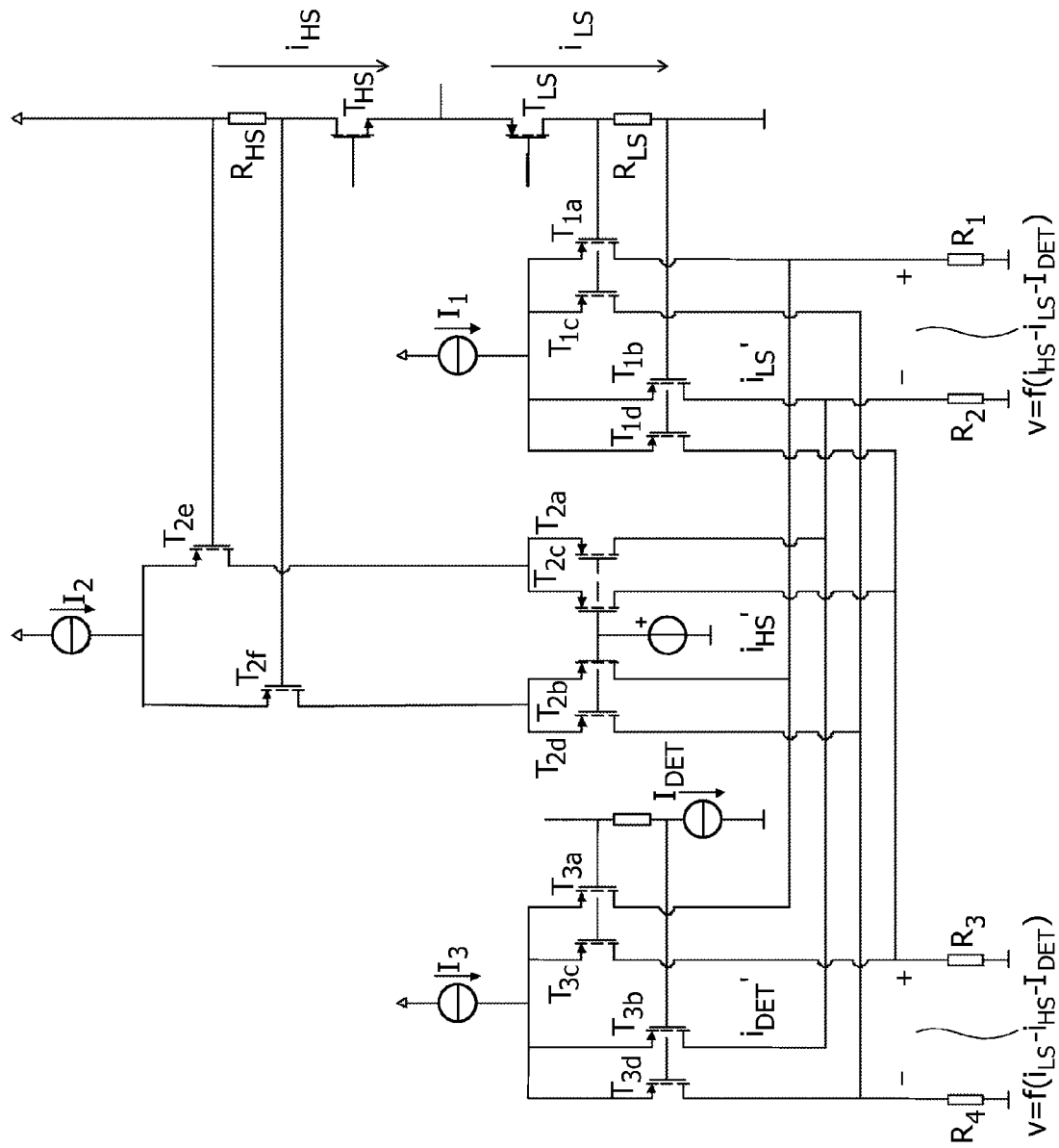
FIG. 7 shows a simplified schematic of a current detection means according to an aspect of the present invention.

FIG. 7 shows a simplified schematic of a current detection circuit according to an aspect of the present invention. Here, the complete current detection circuit is shown. In this circuit, transistors T1a-T1d form two differential pairs measuring the low-side current ILS. Transistors T2e and T2f form a differential pair, measuring the high-side current IHS, of which the output currents are split in two by T2a to T2d. Transistors T3a to T3d form two differential pairs measuring the reference current IDET. All currents are summed such that the voltage difference on R1, R2 and R3, R4 establishes the intended current measurements. If the resistors RHS and RLS are assumed to have the same values and the resistors R1 to R4 to be also substantially equal and all differential pairs have a transconductance of ½ gm, the voltages across R1, R2 and R3, R4 are:

$$v(R_1,R_2) = R_{LS} \cdot g_m \cdot R_1 \cdot (i_{HS} - i_{HS} - I_{DET}) \quad [V]$$

$$v(R_3,R_4) = R_{LS} \cdot g_m \cdot R_1 \cdot (i_{LS} - i_{HS} - I_{DET}) \quad [V]$$

If the values of the resistors RHS and RLS are small, the transconductance gm of the MOS differential pair is small in order to save current, than, the voltages v(R1, R2) and v(R3, R4) are also small. Accordingly, a comparator having large gain is required. An example for an appropriate comparator is shown in FIG. 8.

Figure 8:
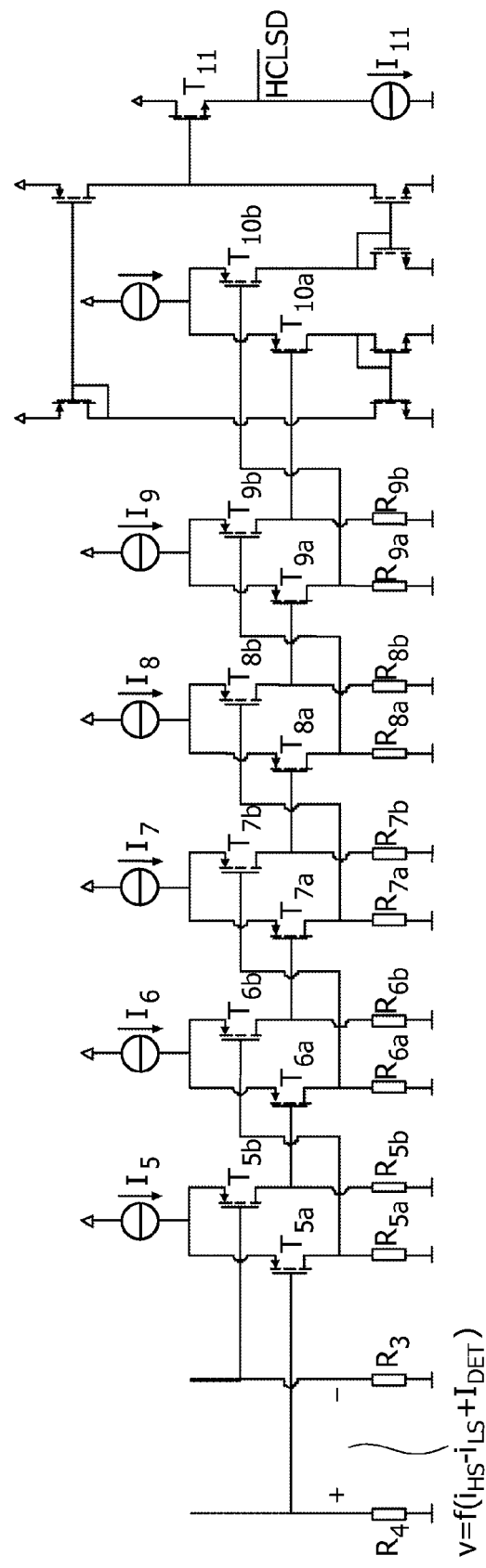
FIG. 8 shows a simplified schematic of a comparator stage according to an aspect of the present invention.

FIG. 8 shows a simplified schematic of a comparator according to an aspect of the present invention. The comparator includes 5 similar stages each of which consists of two transistors T5a, T5b to T9a, T9b, two corresponding resistors R5a, R5b to R9a, R9b, and a current source I5 to I9. The transistors T5a, T5b of the first stage are coupled to resistors R3, R4 shown in FIG. 7. Each stage is coupled in the same manner to the respective next stage in order to increase the gain of the circuit. The last of the five stages is coupled to a circuit including transistors T10a, T10b and current mirrors, the output of which is coupled to transistor T11 providing the output signal HCLSD (High Current Low Side Detected) of the comparator.

Two of the complete comparator stages shown in FIG. 8 are needed: one for the voltage drop across resistors R1, R2 and one for the voltage drop across resistors R3, R4 shown in FIG. 7. The comparator stages are followed by a timing detection means TDM to measure the pulse duration of the signals generated by the comparators. Since the current in the amplifier's output stage OS can not be higher than IDET and lower than −IDET simultaneously, only one of the two comparators is able to trigger. Accordingly, only a single timer can serve as timing detection means. The circuit is shown in FIG. 9.

Figure 9:
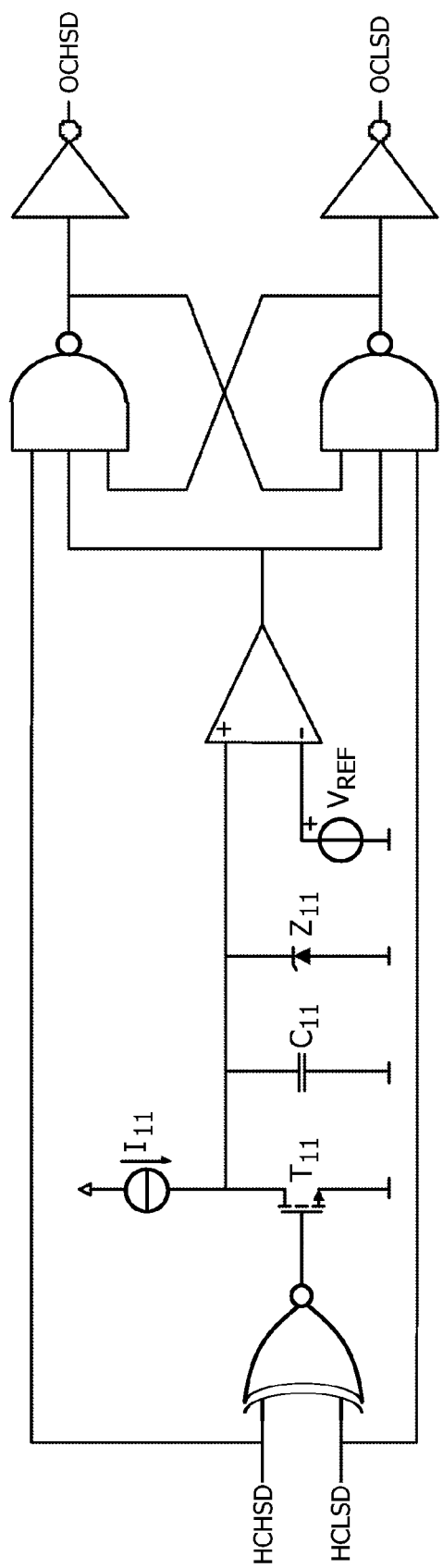
FIG. 9 shows a simplified schematic of a timing detection means according to an aspect of the present invention.

FIG. 9 shows a simplified schematic of a timing detection means TDM including a timer stage according to an aspect of the present invention. The signals HCHSD (High Current High-Side Detected) and HCLSD (High Current Low-Side Detected) are the respective outputs of two comparators each being substantially similar to the one shown in FIG. 8. The signals HCHSD, HCLSD are input to an exclusive OR and two NAND gates in a feedback configuration. The outputs of the NAND gates are input to two inverters. The outputs OCHSD (Over-Current High-Side Detected) and OCLSD (Over Current Low-Side Detected) of the inverters indicate if an over-current on the high-side (i.e. transistor THS) or on the low-side (i.e. transistor TLS) of the output stage OS as shown in FIGS. 3 to 5 was detected. The core of the timer includes transistor T11, capacitor C11 and current source I11 as well as a diode Z11 and an amplifier.

The output of the exclusive OR is input to transistor T11. Under normal conditions both input signals HCHSD, and HCLSD are low, so the output of the exclusive OR is low. Accordingly, transistor T11 is turned on and capacitor C11 is kept discharged. In this situation, the output signals OCHSD and OCLSD are both low. If one of the inputs signals HCHSD, and HCLSD is high, transistor T11 is closed and the current source I11 starts to charge the capacitor C11. When the voltage on the capacitor C11 reaches the reference voltage VREF, the output of the amplifier turns high, and one of the NAND gates (dependent on which of the inputs, HCHSD or HCLSD, is high) turns its output low. Accordingly, the corresponding output signal, either OCHSD or OCLSD, will turn high. The exclusive OR at the timer's input serves to eliminate conditions where both HCHSD and HCLSD are high. The triple NAND gates are arranged in a flip-flop-like feedback structure to ensure that OCHSD and OCLSD can not be high at the same time. The output signals OCHSD and OCLSD now indicate that an over-current through the output devices THS, TLS of the output stage OS was detected. Based on the signals OCHSD, OCLSD measures are to be taken in order to protect the output devices THS, TLS. However, this invention focuses on the detection of over-currents rather than on the measures to eliminate or reduce them.

The over-current detection mechanisms according to the invention can be applied in any amplifier, which requires protection against short circuits, e.g. to wide bandwidth video output amplifiers (or RGB amplifier), preferably in SOI technology, which directly drive the cathodes of a cathode ray tube (CRT). According to this kind of application, several protection diodes force the amplifier outputs to the supply voltage or to ground during picture tube flashovers. Particularly for SOI technologies, the excessive self-heating of the output transistors during flashovers entails problems which are solved by the present invention. Additionally, the mentioned application relates to signal frequencies up to 30 MHz, which are far beyond the thermal time constant of the output devices and the cathode of a CRT represents a substantially capacitive load.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim in numerating several means, several of these means can be embodied by one and the same item of hardware. The mere fact that certain measures are resided in mutually different dependent claims does not indicate that a combination of these measures cannot be used to advantage.

Furthermore, any reference signs in the claims shall not be considered as limiting the scope of the claims.

The invention claimed is:

1. An electronic device with an amplifier output stage and an over-current detection means for detecting an output over-current of the output stage, the over-current detection means comprising:
   a level detection means for detecting a level of the output current exceeding a first level of the output current, and
   a timing detection means for detecting a duration during which the output current exceeds the first current level being a maximum current level.

2. The electronic device according to claim 1, wherein the output stage comprises a high-side output device and a low side output device and the over-current detection means comprises further
   a current difference detection means for detecting a difference between the low-side output current flowing through the low-side output device and the high-side output current flowing through the high-side output device, wherein the current difference detection means detects whether the current difference exceeds the predefined first current level.

3. The electronic device according to claim 2, wherein the over-current detection means comprise a first comparing means to determine whether the difference between the low-side output current and the high side output current exceeds a predefined positive first current level and a second comparing means to determine whether the difference between the low-side output current and the high side output current exceeds a predefined negative second current level.

4. The electronic device according to claim 3, wherein the first and second comparing means are operately coupled to the timing detection means, the timing detection means comprising a single timer being operately coupled to the first and second comparing means.

5. The electronic device of claim 1, comprising further a cathode ray tube, wherein the output stage is coupled to the cathodes of the cathode ray tube.

6. The electronic device of claim 5, being at least partially implemented in a silicon on insulator technology.

7. Displaying apparatus comprising an electronic device, according to claim 1.

8. A method for detecting an over-current of an amplifier output stage of an electronic device, the method comprising the steps of:
   detecting a level of the output current exceeding a first level of the output current, and
   detecting a duration during which the output current exceeds the first level of the output current.

9. The method according to claim 8, wherein the output stage comprises a high-side output device and a low side output device, and the step of detecting a level of the output current exceeding a first level of the output current comprises:
   determining the difference between the low-side output current flowing through the low-side output device and the high-side output current flowing through the high-side output device, and
   detecting whether the determined current difference exceeds a predefined first current level.

10. The method according to claim 9, wherein the step of detecting whether the determined current difference exceeds a predefined first current level further comprises the steps of:
    comparing the difference between the low-side output current and the high-side output current with a positive first current level, and
    comparing the difference between the low-side output current and the high-side output current with a negative second current level.

* * * * *